US012713524B2

(12) United States Patent
Hishinuma et al.

(10) Patent No.: US 12,713,524 B2
(45) Date of Patent: Aug. 18, 2026

(54) STRETCHABLE DEVICE

(71) Applicant: Magnolia White Corporation, Tokyo (JP)

(72) Inventors: Masatomo Hishinuma, Tokyo (JP); Yosuke Hyodo, Tokyo (JP)

(73) Assignee: Magnolia White Corporation, Tokyo (JP)

( * ) Notice: Subject to any disclaimer, the term of this patent is extended or adjusted under 35 U.S.C. 154(b) by 172 days.

(21) Appl. No.: 18/826,416

(22) Filed: Sep. 6, 2024

(65) Prior Publication Data

US 2025/0089158 A1 Mar. 13, 2025

(30) Foreign Application Priority Data

Sep. 7, 2023 (JP) ................................ 2023-145430

(51) Int. Cl.
*H05K 1/02* (2006.01)

(52) U.S. Cl.
CPC .................................. *H05K 1/0283* (2013.01)

(58) Field of Classification Search
CPC .................................................... H05K 1/0283
USPC ........................................................ 174/254
See application file for complete search history.

(56) References Cited

U.S. PATENT DOCUMENTS

2022/0087010 A1 3/2022 Sano

FOREIGN PATENT DOCUMENTS

JP 2020202208 A 12/2020

*Primary Examiner* — Timothy J Thompson
*Assistant Examiner* — Obaidul Gani
(74) *Attorney, Agent, or Firm* — Maier & Maier, PLLC

(57) ABSTRACT

According to an aspect, a stretchable device includes: a stretchable substrate extending in a planar direction; and a pair of stretchable resin layers with the stretchable substrate therebetween in a stacking direction. One of the stretchable resin layers has a surface. The surface has, when viewed in the stacking direction, a center region and a frame region surrounding the center region. The stretchable substrate includes a resin base member and an array layer disposed in the stacking direction. The resin base member includes a hinge meandering and extending in the planar direction. The hinge includes arcs formed in an arc shape when viewed in the stacking direction. The arcs have a center region arc disposed in the center region and a frame region arc disposed in the frame region. The radius of curvature of the frame region arc is smaller than that of the center region arc.

7 Claims, 9 Drawing Sheets

STRETCHABLE DEVICE

CROSS-REFERENCE TO RELATED APPLICATION

This application claims the benefit of priority from Japanese Patent Application No. 2023-145430 filed on Sep. 7, 2023, the entire contents of which are incorporated herein by reference.

BACKGROUND

1. Technical Field

What is disclosed herein relates to a stretchable device.

2. Description of the Related Art

Stretchable devices include a stretchable substrate with excellent elasticity and flexibility. As described in Japanese Patent Application Laid-open Publication No. 2020-202208, the stretchable substrate includes a resin base member and an array layer provided on the resin base member. The resin base member includes hinges. The hinge has what is called a meandering shape and meanders and extends in the planar direction. The array layer is provided with an electrical circuit. Examples of the electrical circuit include, but are not limited to, a strain detecting circuit that detects a stretching load in the planar direction of the stretchable device, a force detecting circuit that detects force applied to the surface of the stretchable device, a light detecting circuit that detects light incident on the stretchable device, etc.

In the electrical circuit described above, detection elements that detect a load or the like are typically disposed at the center of the stretchable device (hereinafter referred to as a center region). In other words, the center region serves as a detection region for detecting a load or the like. By contrast, the ends of the stretchable device surrounding the center of the stretchable device are provided with wiring and other components that supply signals and electric power to the detection elements. The ends of the stretchable device are hereinafter referred to as a frame region because they have a frame shape.

The size of the hinge is large in the direction perpendicular to the line coupling one end and the other of the hinge (hereinafter, which may be referred to as a width direction) because the hinge is meandering. In other words, the area in the width direction occupied by the hinge is large, and the area of the frame region of the stretchable device is increased.

For the foregoing reasons, there is a need for a stretchable device having a frame region with a smaller area.

SUMMARY

According to an aspect, a stretchable device includes: a stretchable substrate extending in a planar direction including a first direction and a second direction intersecting the first direction; and a pair of stretchable resin layers with the stretchable substrate interposed therebetween in a stacking direction intersecting the planar direction. One of the stretchable resin layers has a surface facing a side opposite to the stretchable substrate. The surface has, when viewed in the stacking direction, a center region positioned at the center of the surface and a frame region positioned at ends of the surface and surrounding the center region. The stretchable substrate includes a resin base member and an array layer disposed in the stacking direction. The resin base member includes a hinge meandering and extending in the planar direction. The hinge includes a plurality of arcs formed in an arc shape when viewed in the stacking direction. The arcs have a center region arc disposed in the center region and a frame region arc disposed in the frame region. The radius of curvature of the frame region arc is smaller than the radius of curvature of the center region arc.

DETAILED DESCRIPTION

Figure 1:
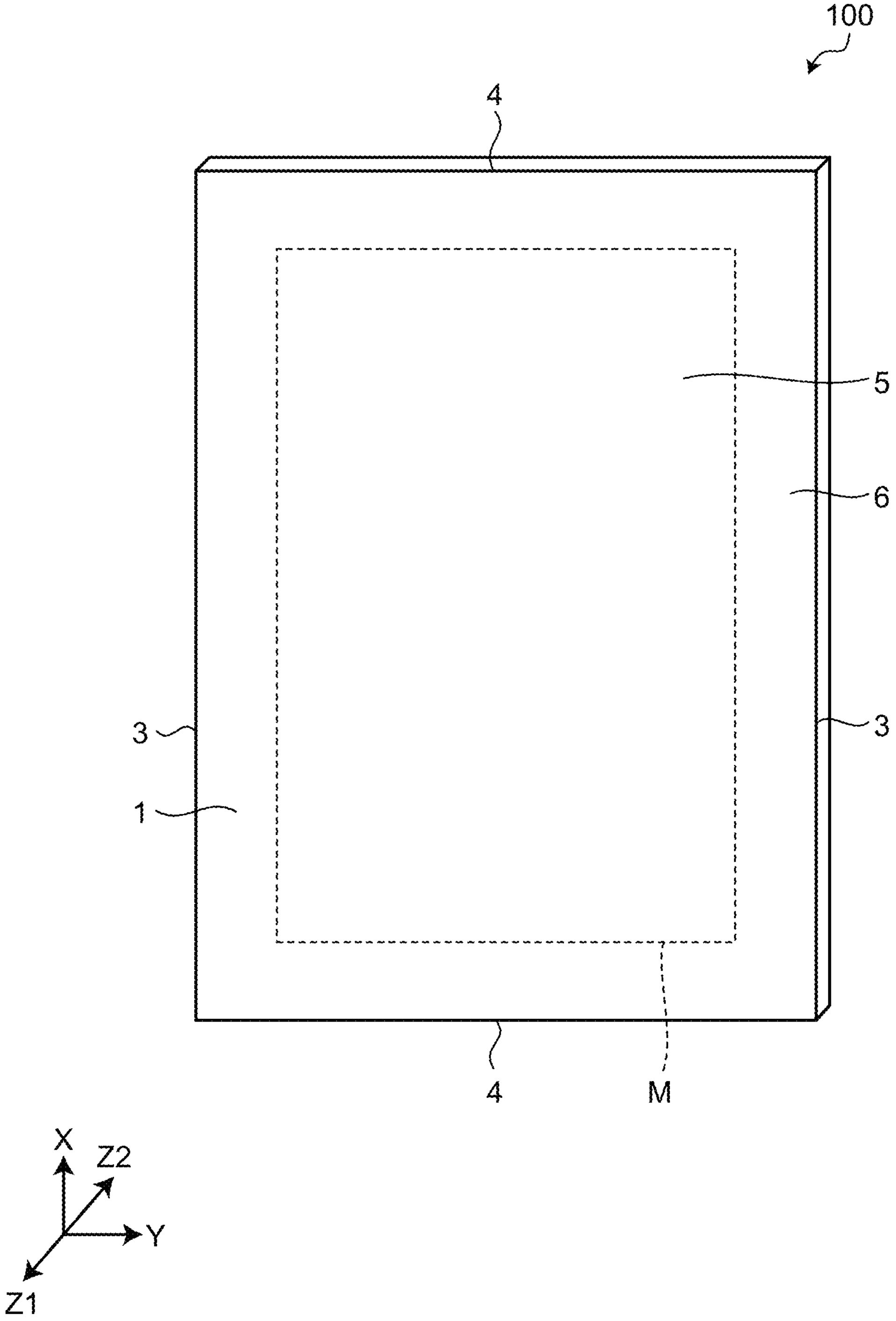
FIG. 1 is a perspective view of a stretchable device according to a first embodiment when viewed from a front surface.

Exemplary aspects (embodiments) to embody the present disclosure are described below in greater detail with reference to the accompanying drawings. The contents described in the embodiments below are not intended to limit the disclosure according to the present disclosure. Components described below include components easily conceivable by those skilled in the art and components substantially identical therewith. Furthermore, the components described below may be appropriately combined. What is disclosed herein is given by way of example only, and appropriate modifications made without departing from the spirit of the present disclosure and easily conceivable by those skilled in the art naturally fall within the scope of the present disclosure. To simplify the explanation, the drawings may possibly illustrate the width, the thickness, the shape, and other elements of each unit more schematically than the actual aspect. These elements, however, are given by way of example only and are not intended to limit interpretation of the present disclosure. In the present specification and the drawings, components similar to those previously described with reference to previous drawings are denoted by the same reference numerals, and detailed explanation thereof may be appropriately omitted.

When the term "on" is used to describe an aspect where a first structure is disposed on or above a second structure in the present specification and the claims, it includes both of the following cases unless otherwise noted: a case where the first structure is disposed on and in contact with the second structure, and a case where the first structure is disposed above the second structure with still another structure interposed therebetween.

First Embodiment

FIG. 1 is a perspective view of a stretchable device according to a first embodiment when viewed from a side facing the front surface. As illustrated in FIG. 1, a stretchable device 100 has a flat plate shape. The stretchable device 100 has a front surface 1 and a back surface 2 (back surface 2 is not illustrated in FIG. 1, and refer to FIG. 2) facing opposite to each other. In the following description, the direction parallel to the front surface 1 and the back surface 2 is referred to as a planar direction. A direction intersecting the planar direction is referred to as a stacking direction.

The stretchable device 100 has a rectangular (quadrilateral) shape when viewed from the side facing the front surface 1. Therefore, the front surface 1 has a pair of long sides 3 and a pair of short sides 4. In the following description, a direction parallel to the planar direction and to the long side 3 is referred to as a first direction X, and a direction parallel to the short side 4 is referred to as a second direction Y.

When viewed from the side facing the front surface 1, the stretchable device 100 is divided into a center region 5 and a frame region 6. The center region 5 is positioned at the center of the front surface 1 of the stretchable device 100 and has a rectangular (quadrilateral) shape when viewed from the side facing the front surface 1. The frame region 6 is positioned at the ends of the front surface 1 of the stretchable device 100 and has a frame shape (quadrilateral frame shape). An imaginary line M illustrated in FIG. 1 and other figures indicates the boundary between the center region 5 and the frame region 6.

Figure 2:
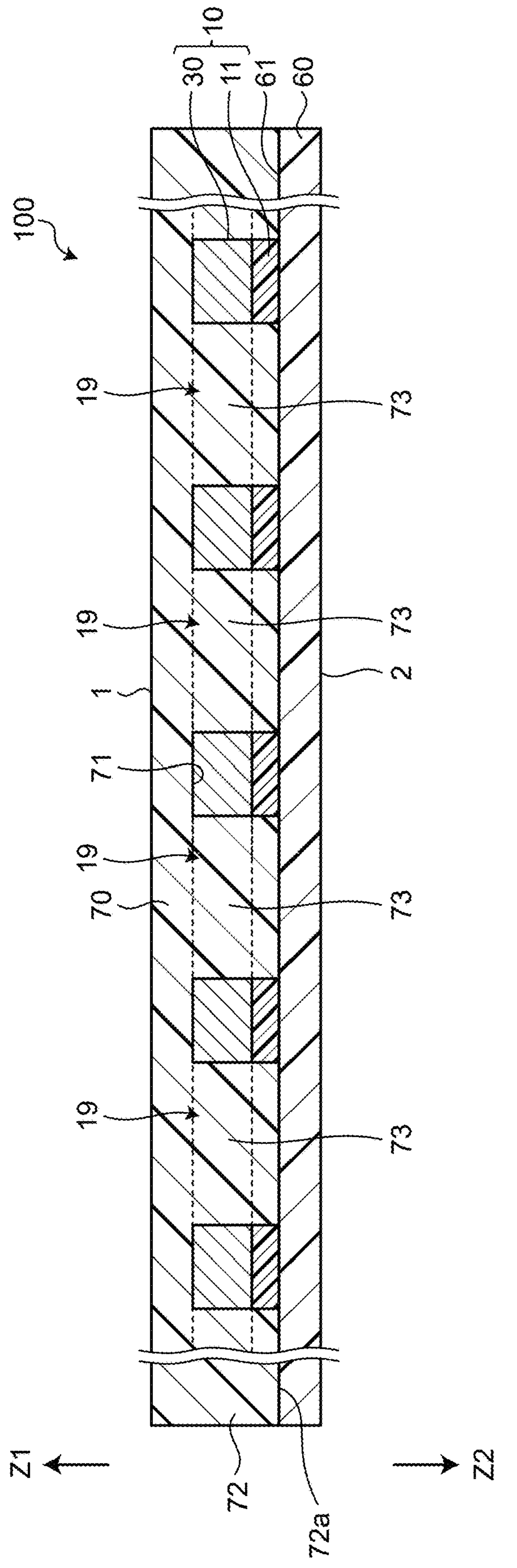
FIG. 2 is a schematic of a section of the stretchable device according to the first embodiment.

FIG. 2 is a schematic of a section of the stretchable device according to the first embodiment. As illustrated in FIG. 2, the stretchable device 100 includes a first stretchable resin layer 60, a stretchable substrate 10, and a second stretchable resin layer 70 stacked in the stacking direction in the order as listed. In other words, the stretchable substrate 10 is sandwiched between a pair of stretchable resin layers (the first stretchable resin layer 60 and the second stretchable resin layer 70).

In the stacking direction, the direction in which the second stretchable resin layer 70 is disposed when viewed from the first stretchable resin layer 60 is hereinafter referred to as a first stacking direction Z1, and the direction opposite to the first stacking direction Z1 is referred to as a second stacking direction Z2. The view of the stretchable device 100 from the first stacking direction Z1 is referred to as plan view.

The first stretchable resin layer 60 and the second stretchable resin layer 70 have insulating, elastic, and flexible properties. The resin used as the first stretchable resin layer 60 and the second stretchable resin layer 70 is acrylic elastomer, for example. The first stretchable resin layer 60 and the second stretchable resin layer 70 according to the present disclosure are not limited to acrylic elastomer. They may be acrylic resin, epoxy resin, urethane resin, or the like and are not particularly limited.

The first stretchable resin layer 60 and the second stretchable resin layer 70 are formed in a plate shape and extend in the planar direction. The surface of the first stretchable resin layer 60 in the second stacking direction Z2 serves as the back surface 2 of the stretchable device 100. The first stretchable resin layer 60 has a stacking surface 61 facing the first stacking direction Z1 and opposed to the stretchable substrate 10.

The surface of the second stretchable resin layer 70 in the first stacking direction Z1 is a surface facing a direction opposite to the stretchable substrate 10 and serves as the front surface 1 of the stretchable device 100. The second stretchable resin layer 70 has a counter surface 71 facing the second stacking direction Z2 and opposed to the stretchable substrate 10. The ends of the second stretchable resin layer 70 are provided with a frame part 72 that extends in the second stacking direction Z2 with respect to the counter surface 71.

The frame part 72 is formed in an annular shape in plan view and surrounds the outer periphery of the stretchable substrate 10. A surface 72*a* of the frame part 72 in the second stacking direction Z2 adheres to the stacking surface 61 of the first stretchable resin layer 60. Therefore, the first stretchable resin layer 60 and the second stretchable resin layer 70 cooperate to serve as a housing that accommodates the stretchable substrate 10.

The stretchable substrate 10 has a plurality of through holes 19 passing therethrough in the stacking direction. The second stretchable resin layer 70 has a plurality of protrusions 73 protruding from the counter surface 71 in the second stacking direction Z2 and filling up the through holes 19.

While the through hole 19 according to the present embodiment is filled with the second stretchable resin layer 70 (protrusion 73), the through hole 19 according to the present disclosure may be filled with the first stretchable resin layer 60. Alternatively, the through hole 19 may be filled with the first stretchable resin layer 60 and the second stretchable resin layer 70. Still alternatively, the through hole 19 may be filled with resin other than the first stretchable resin layer 60 or the second stretchable resin layer 70. Still alternatively, the through hole 19 may be a space provided with nothing.

The stretchable substrate 10 includes a resin base member 11 stacked on the stacking surface 61 of the first stretchable resin layer 60, and an array layer 30 stacked on the resin base member 11. The resin base member 11 adheres to the stacking surface 61 of the first stretchable resin layer 60. The resin base member 11 has elastic, flexible, and insulating properties. The resin base member 11 is made of resin material, such as polyimide.

Figure 3:
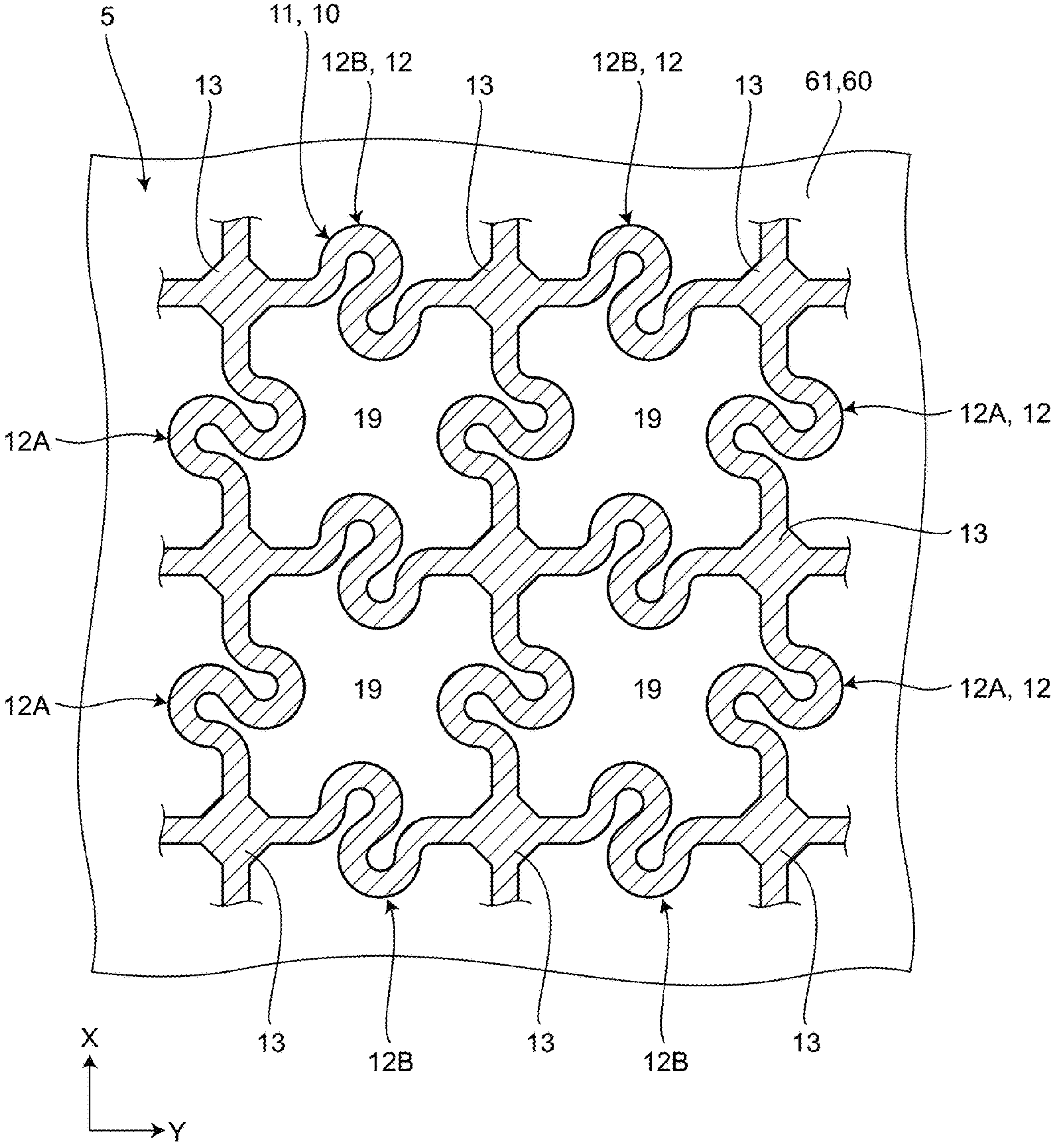
FIG. 3 is a view of part of a resin base member according to the first embodiment when viewed from a first stacking direction.

FIG. 3 is a view of part of the resin base member according to the first embodiment disposed in the center region when viewed from the first stacking direction. As illustrated in FIG. 3, the resin base member 11 includes a plurality of hinges 12 meandering and extending in the planar direction and a plurality of bodies 13.

The hinges 12 include two kinds of hinges: a longitudinal hinge 12A extending in the first direction X, and a lateral hinge 12B extending in the second direction Y. When the lateral hinge 12B is rotated by 90 degrees, it has the same shape as that of the longitudinal hinge 12A. Therefore, in detailed explanation of the hinge 12, which will be described later, the longitudinal hinge 12A is described as a representative example, and explanation of the lateral hinge 12B is omitted. The body 13 is disposed at the junction of the longitudinal hinges 12A and the lateral hinges 12B and is coupled to the longitudinal hinges 12A and the lateral hinges 12B.

The body 13 has a quadrilateral (square) shape in plan view. The body 13 is disposed with its four corners facing the first direction X and the second direction Y. The bodies 13 are arrayed in the first direction X and the second direction Y and are separated from one another. The shape of the body 13 according to the present disclosure in plan view is not limited to a quadrilateral shape and may be circular or other polygonal shapes.

The part not provided with the bodies 13 or the hinges 12 in the resin base member 11 serves as the through hole 19 passing through the stretchable substrate 10 in the thickness direction.

The array layer 30 includes a plurality of insulating layers stacked in the stacking direction and an electrical circuit provided in the insulating layers, which are not specifically illustrated. Examples of the electrical circuit include, but are not limited to, a strain detecting circuit that detects a stretching load in the planar direction of the stretchable device 100, a force detecting circuit that detects force applied to the surface of the stretchable device 100, a light detecting circuit that detects light incident on the stretchable device 100, etc. The type of the electrical circuit according to the present disclosure is not particularly limited.

In this electrical circuit, functional elements, such as transistors, are stacked on the bodies 13. The wiring that supplies signals and electric power to the functional elements is disposed over the hinges 12 and the bodies 13 and extends in the planar direction.

In the stretchable device 100 with the structure described above, the parts (hinges 12) adjacent to the through holes 19 have low rigidity. When a load in the planar direction acts on the stretchable device 100, the hinges 12 deform. By contrast, the amount of deformation of the bodies 13 is significantly small, thereby reducing damage to the functional elements stacked on the bodies 13.

Figure 4:
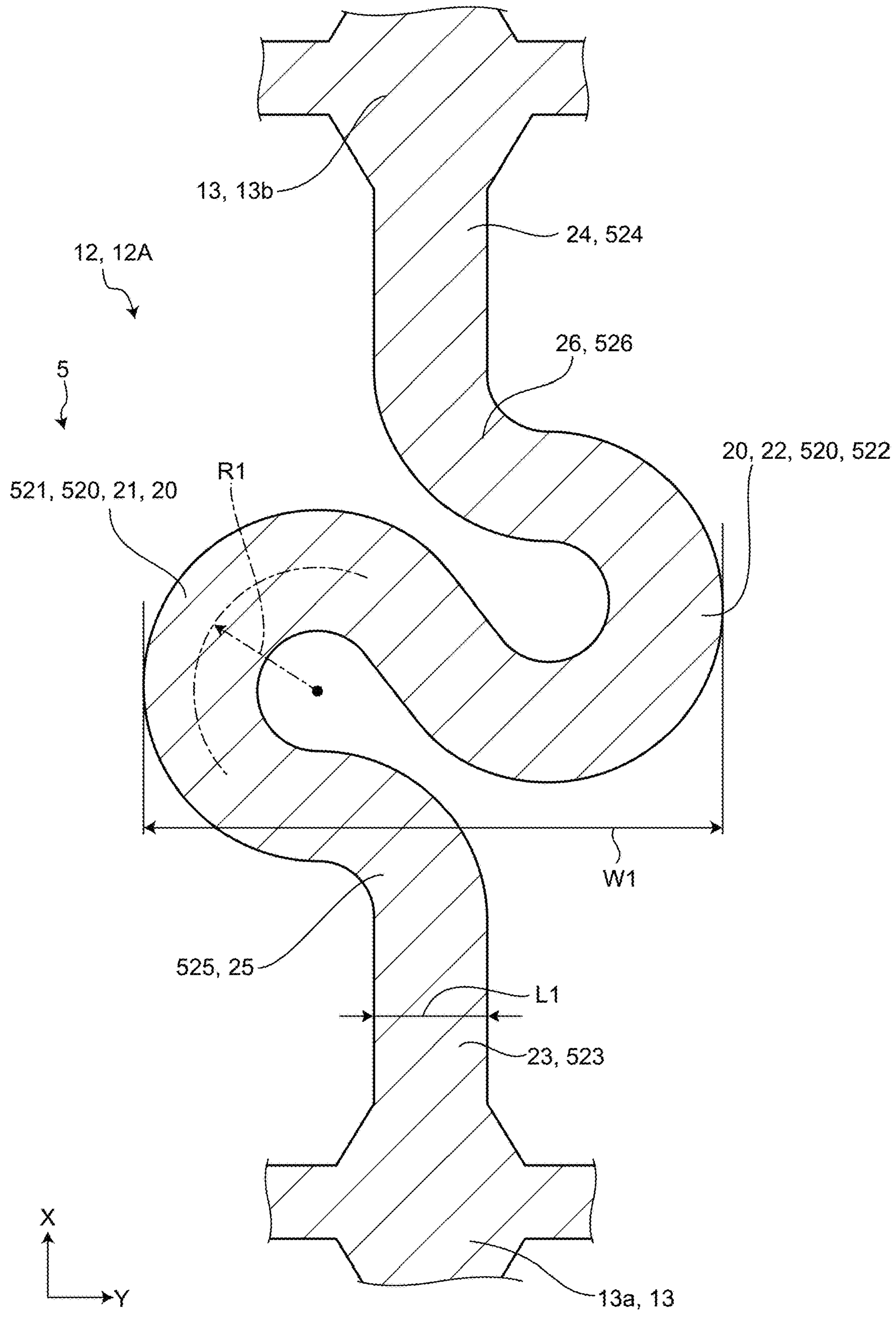
FIG. 4 is a view of a longitudinal hinge according to the first embodiment when viewed from the first stacking direction.

The following describes the hinge 12 of the stretchable substrate 10 in greater detail. FIG. 4 is a view of the longitudinal hinge according to the first embodiment when viewed from the first stacking direction. For the convenience of explanation, one of the two bodies 13 provided at opposite ends of the longitudinal hinge 12A is referred to as a first body 13*a*, and the other is referred to as a second body 13*b*.

The longitudinal hinge 12A includes arcs 20 having an arc shape. The arcs 20 each have a first arc 21 protruding on one side in the second direction Y and a second arc 22 protruding on the other side in the second direction Y. Therefore, the longitudinal hinge 12A meanders in the second direction Y.

A linear first base 23 is provided between the first arc 21 and the first body 13*a*. A linear second base 24 is provided between the second arc 22 and the second body 13*b*. The coupling part between the first arc 21 and the first base 23 is an arc-shaped first bend 25. The coupling part between the second arc 22 and the second base 24 is an arc-shaped second bend 26. The first bend 25 and the second bend 26 each form a quadrant.

Figure 5:
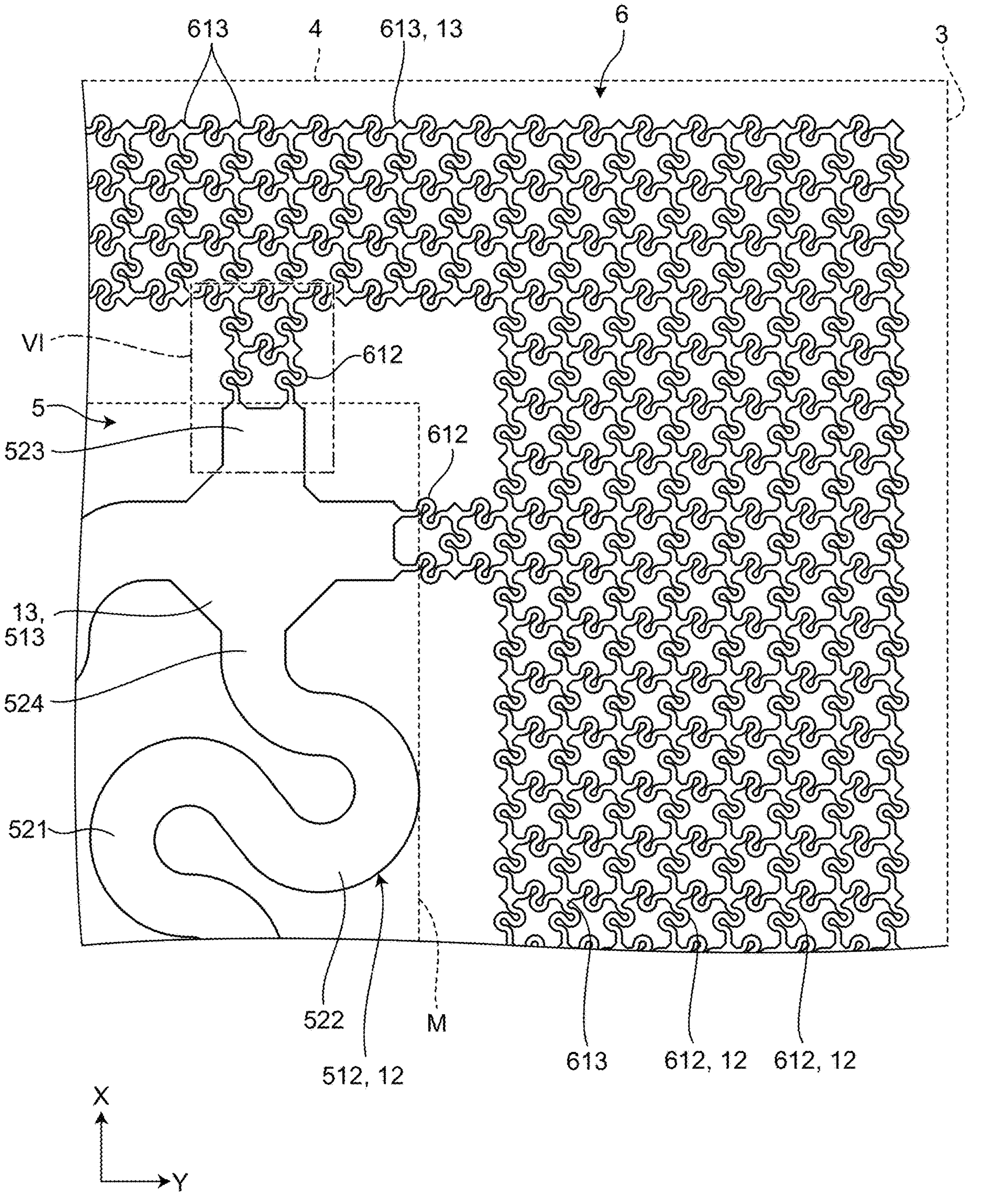
FIG. 5 is an enlarged view of a region at and near the boundary between a center region and a frame region in the resin base member according to the first embodiment.

This is the basic configuration of the hinge 12 (longitudinal hinge 12A). FIG. 5 is an enlarged view of a region at and near the boundary between the center region and the frame region in the resin base member according to the first embodiment. As illustrated in FIG. 5, the resin base member 11 is included in both the center region 5 and the frame region 6 in plan view. Therefore, the hinges 12 has a center region hinge 512 disposed in the center region 5 and a frame region hinge 612 disposed in the frame region 6. The bodies 13 has a center region body 513 disposed in the center region 5 and a frame region body 613 disposed in the frame region 6. The following describes the center region hinge 512 and the frame region hinge 612 in greater detail.

As illustrated in FIG. 4, the center region hinge 512 has a center region first base 523 (first base 23), a center region first bend 525 (first bend 25), a center region first arc 521 (first arc 21), a center region second arc 522 (second arc 22), a center region second bend 526 (second bend 26), and a center region second base 524 (second base 24) arranged in this order from the first body 13*a* toward the second body 13*b*. In the following description, the center region first arc 521 and the center region second arc 522 are collectively referred to as a center region arc 520.

The width L1 of the center region hinge 512 is constant from one end to the other end of the center region hinge 512. Therefore, the width of the center region arc 520 is L1. The radius of curvature of the center region arc 520 is R1. The size in the width direction (second direction Y in FIG. 4) occupied by the center region first arc 521 and the center region second arc 522 is W1. In other words, the size in the width direction occupied by the center region hinge 512 is W1.

As illustrated in FIG. 5, some of the center region hinges 512 are disposed in the frame region 6 beyond the imaginary line M. Thus, in the vicinity of the imaginary line M in the present disclosure, some of the center region hinges 512 may be disposed in the frame region 6, or some of the frame region hinges 612 may be disposed in the center region 5.

Figure 6:
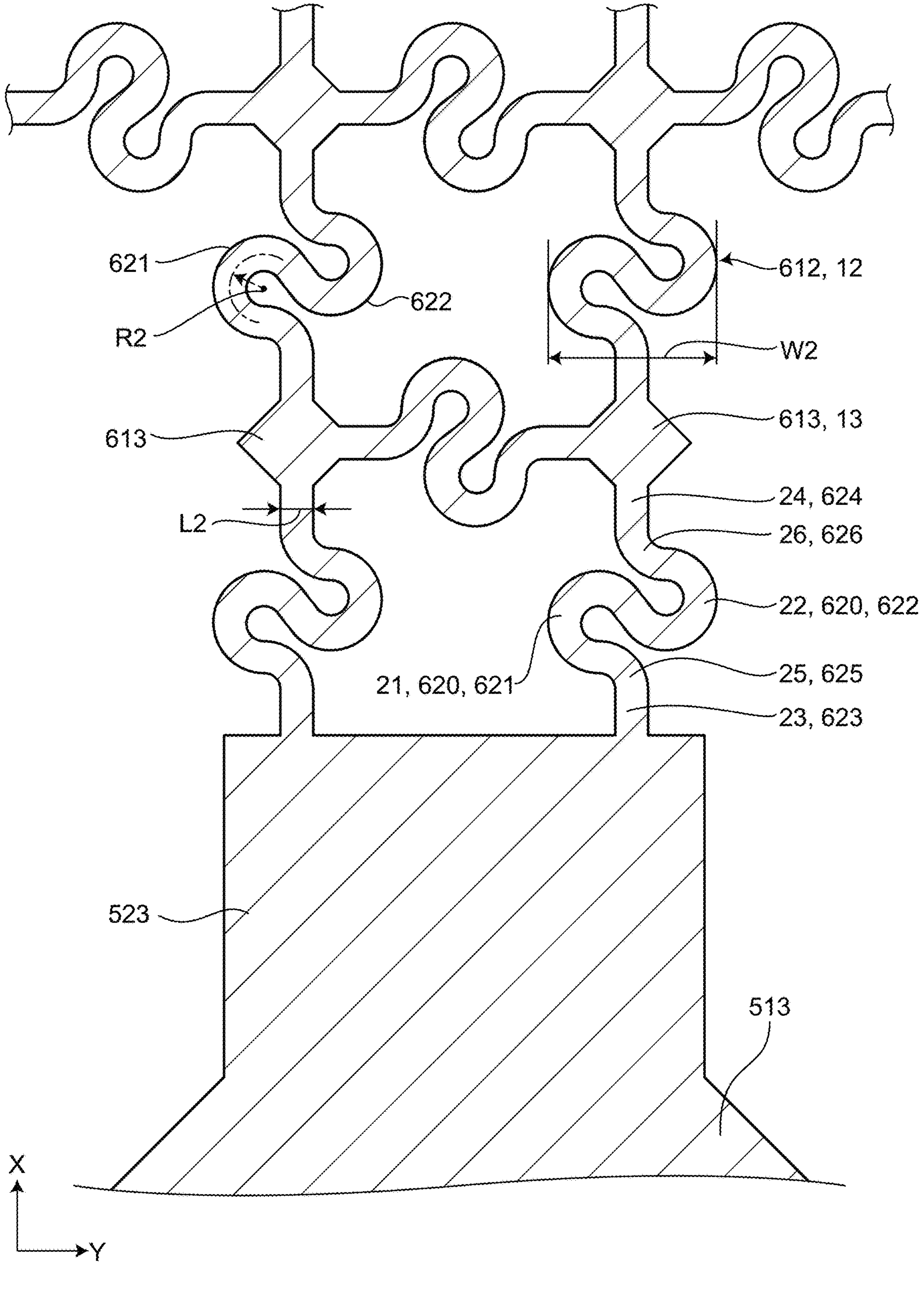
FIG. 6 is an enlarged view of the region surrounded by frame line VI of FIG. 5.

FIG. 6 is an enlarged view of the region surrounded by frame line VI of FIG. 5. As illustrated in FIG. 6, the frame region hinge 612 has a frame region first base 623 (first base 23), a frame region first bend 625 (first bend 25), a frame region first arc 621 (first arc 21), a frame region second arc 622 (second arc 22), a frame region second bend 626 (second bend 26), and a frame region second base 624 (second base 24) arranged in the order as listed. In the following description, the frame region first arc 621 and the frame region second arc 622 are collectively referred to as a frame region arc 620.

The width L2 of the frame region hinge 612 is constant from one end to the other end of the frame region hinge 612. Therefore, the width of the frame region arc 620 is L2.

The radius of curvature of the frame region arc 620 is R2. The radius of curvature R2 of the frame region arc 620 is smaller than the radius of curvature R1 of the center region arc 520 (refer to FIG. 4). Therefore, the size W2 (refer to FIG. 6) in the width direction occupied by the frame region first arc 621 and the frame region second arc 622 is smaller than the size W1 (refer to FIG. 4) in the width direction occupied by the center region first arc 521 and the center region second arc 522. In other words, the area in the width direction occupied by the frame region hinge 612 is smaller than that occupied by the center region hinge 512. With this configuration, the area of the frame region 6 can be reduced without reducing the number of frame region hinges 612 disposed in the width direction of the frame region hinge 612.

In terms of the arc 20, the length of the arc 20 increases and the arc 20 is more likely to deform, as the radius of curvature (R1, R2) increases. By contrast, the rigidity of the arc 20 increases and the arc 20 is less likely to deform, as the width (L1, L2) of the arc 20 increases. In the present embodiment, the value obtained by dividing the radius of curvature R2 by the width L2 (R2/L2) is equal to the value obtained by dividing the radius of curvature R1 by the width L1 (R1/L1). In other words, the frame region arc 620 and the center region arc 520 are similar in shape (the reduction ratio in the first direction X is equal to the reduction ratio in the second direction Y). Therefore, the frame region arc 620 and the center region arc 520 have the same stretchability (deformability).

In the present embodiment, not only the arcs 20 (the frame region arc 620 and the center region arc 520) but also the entire shape of the frame region hinge 612 and that of the center region hinge 512 are similar (the reduction ratio in the first direction X is equal to the reduction ratio in the second direction Y). Therefore, the frame region hinge 612 and the center region hinge 512 also have the same stretchability. In addition, the frame region body 613 and the center region body 513 are also similar in shape (the reduction ratio in the first direction X is equal to the reduction ratio in the second direction Y). The reduction ratio of the frame region body 613 to the center region body 513 is equal to that of the frame region hinge 612 to the center region hinge 512.

While the first embodiment has been described above, the present embodiment is not limited to the example described in the first embodiment. For example, in the present embodiment, the value obtained by dividing the radius of curvature R2 by the width L2 (R2/L2) is equal (similar in shape) to the value obtained by dividing the radius of curvature R1 by the width L1 (R1/L1), but the values according to the present disclosure are not necessarily equal. In other words, the frame region arc 620 and the center region arc 520 according to the present disclosure are not necessarily similar in shape. This is because the hinges 12 with such a structure can also reduce the area of the frame region 6 if the radius of curvature R2 of the frame region arc 620 is smaller than the radius of curvature R1 of the center region arc 520. Therefore, the frame region hinge 612 and the center region hinge 512 according to the present disclosure are not necessarily similar in shape. The frame region body 613 and the center region body 513 are not necessarily similar in shape. Even if the frame region body 613 and the center region body 513 are similar in shape, the reduction ratio of the frame region body 613 to the center region body 513 is not necessarily equal to that of the frame region hinge 612 to the center region hinge 512.

The frame region body 613 according to the present disclosure is not necessarily disposed between the frame region hinges 612. The following describes a first modification in which no frame region body 613 is disposed. The following description of the modifications focuses on the differences from the first embodiment.

Figure 7:
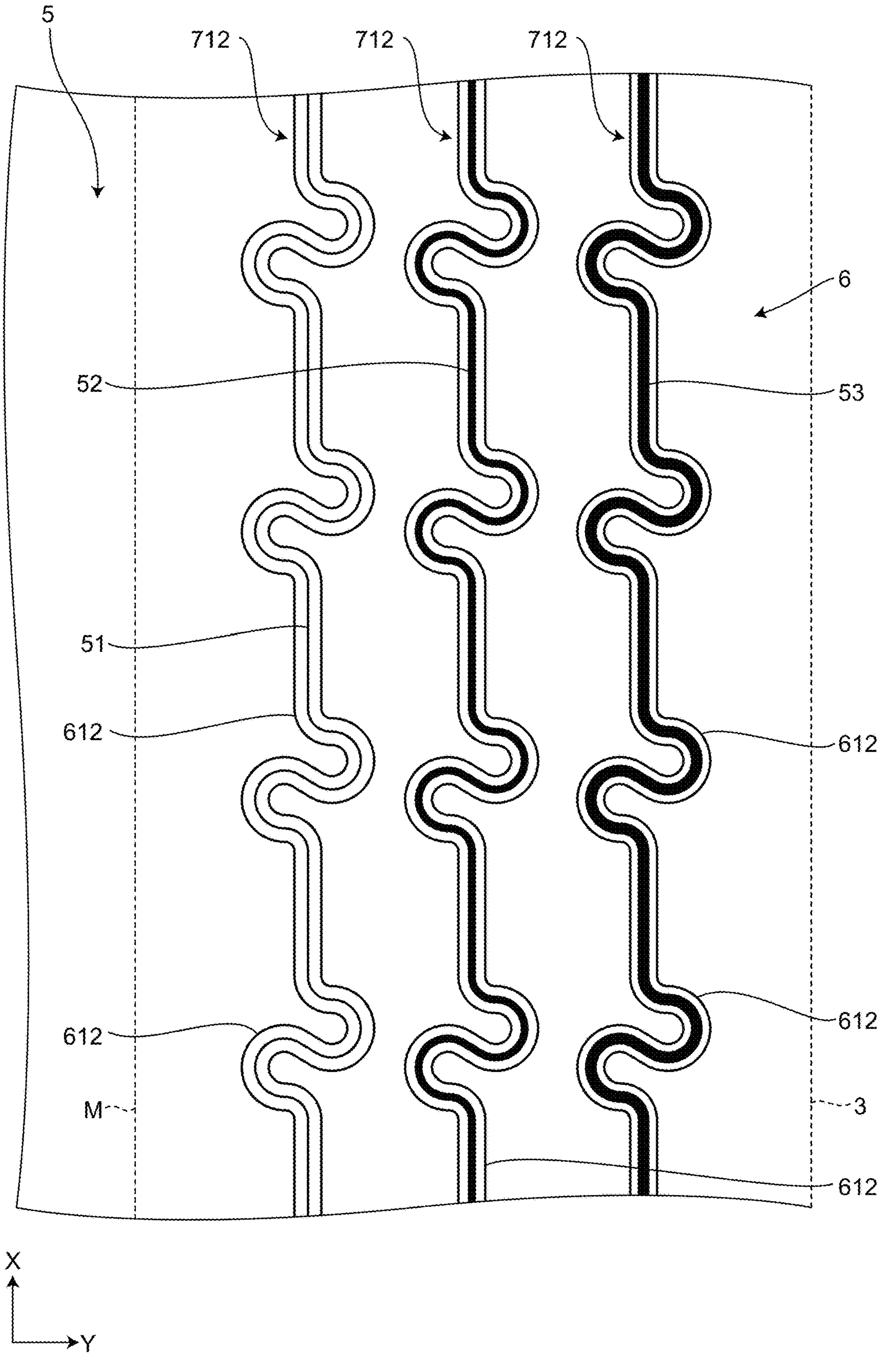
FIG. 7 is a view of the resin base member disposed in the frame region according to a first modification when viewed from the first stacking direction.

FIG. 7 is a view of the resin base member 11 disposed in the frame region 6 according to the first modification when viewed from the first stacking direction. As illustrated in FIG. 7, the resin base member 11 according to the first modification is different from the first embodiment in that only the frame region hinges 612 are disposed in the frame region 6. Therefore, each frame region hinge 612 is coupled to the ends of the adjacent frame region hinges 612. The frame region hinges 612 are joined together to form a long hinge 712.

The long hinge 712 circumferentially extends outside the center region 5, which is not specifically illustrated. One end of the long hinge 712 extends to the center region 5 and is coupled to the center region body 513 disposed in the center region 5. As a result, the wiring disposed on the long hinge 712 is coupled to the elements disposed in the center region 5. The long hinges 712 do not intersect with (are not coupled to) one another. The long hinge 712 disposed on the outer periphery side extends around the outer side of the long hinge 712 disposed on the inner periphery side to the center region 5. Therefore, among the long hinges 712, the long hinge 712 disposed on the outer periphery side has a larger length.

Wires 51, 52, and 53 of the array layer 30 are stacked on the long hinges 712 according to the first modification. The wiring lines 51, 52, and 53 extend along the long hinges 712. Therefore, the wiring lines 51, 52, and 53 circumferentially extend outside the center region 5, in the same manner as the long hinges 712.

The wiring lines 51, 52, and 53 are arrayed in this order from the center region 5 toward the outer side. In other words, the wiring line 52 (outer peripheral wiring) is disposed on the outer periphery side with respect to the wiring line 51 (inner peripheral wiring) and has a longer length than the wiring line 51. Similarly, the wiring line 53 (outer peripheral wiring) is disposed on the outer periphery side with respect to the wiring line 52 (inner peripheral wiring) and has a longer length than the wiring line 52.

In this arrangement relation, the width of the wiring line 52 (outer peripheral wiring) is larger than that of the wiring line 51 (inner peripheral wiring). The width of the wiring line 53 (outer peripheral wiring) is larger than that of the wiring line 52 (inner peripheral wiring). The resistance of wiring is calculated by dividing the length of the wiring by the cross-sectional area (width) of the wiring line. If the widths of the wiring lines 51, 52, and 53 are equal to one another, the resistance decreases in the order of the wiring lines 53, 52, and 51 corresponding to the descending order of length. In the first modification, the cross-sectional area (width) of the wiring line increases as the length increases, and the resistances of the wiring lines 51, 52, and 53 are equal to one another. Therefore, the same amount of current, for example, can be supplied to the elements coupled to the wiring lines 51, 52, and 53, thereby improving detection accuracy.

While one wiring line is disposed on one hinge 12 (long hinge 712) according to the first modification described above, the present disclosure is not limited thereto. The following describes a second modification where a plurality of wiring lines are disposed on one hinge 12 (long hinge 712).

Figure 8:
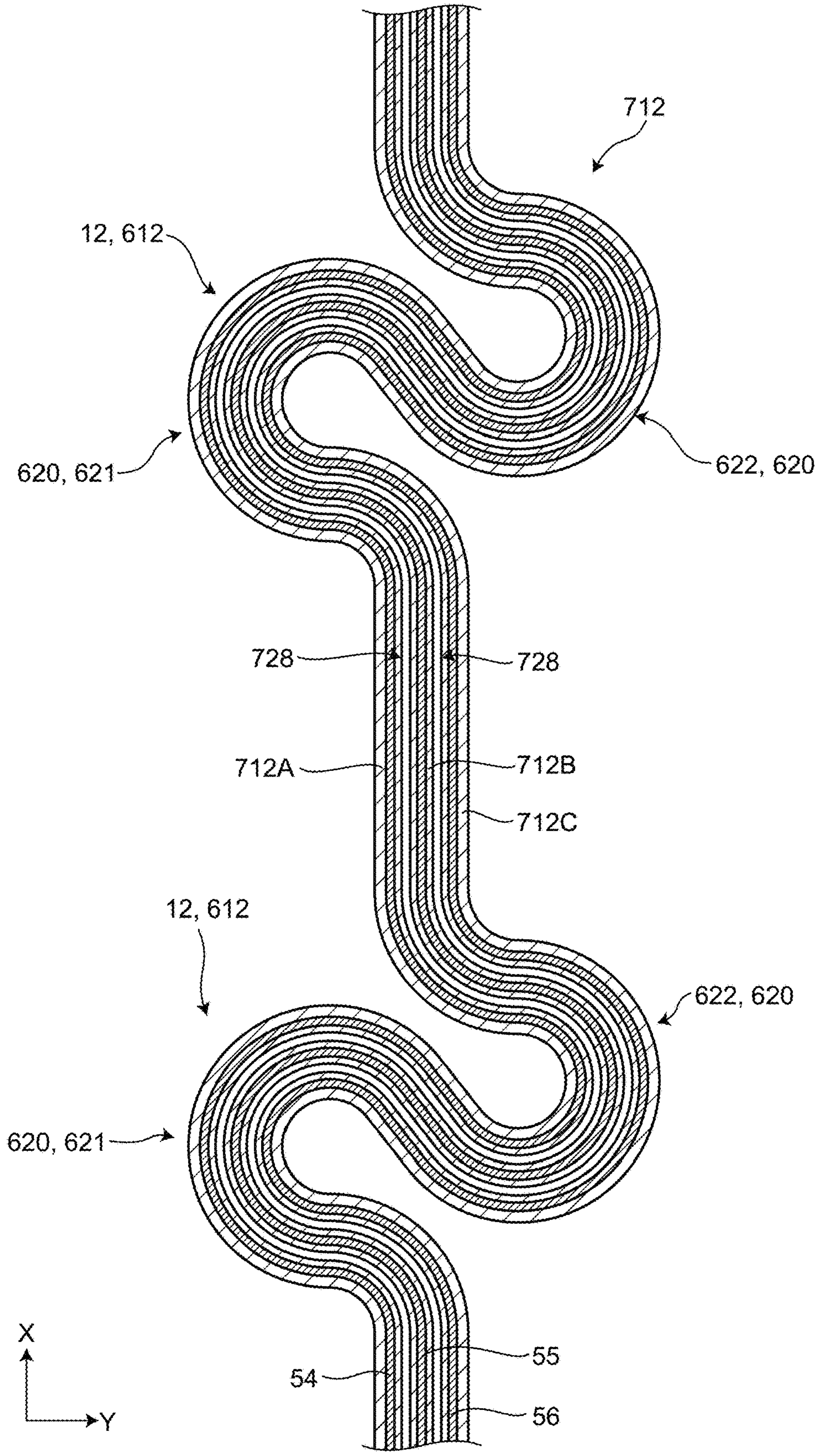
FIG. 8 is a view of the resin base member disposed in the frame region according to a second modification when viewed from the first stacking direction.

FIG. 8 is a view of the resin base member 11 disposed in the frame region 6 according to the second modification when viewed from the first stacking direction. Three wiring lines 54, 55, and 56 are disposed on one long hinge 712 (frame region hinges 612). The second modification requires a smaller number of long hinges 712 and can further reduce the area of the frame region 6.

The long hinge 712 has two slits 728 extending along the extending direction of the long hinge 712. Therefore, the long hinge 712 has three divided hinges 712A, 712B, and 712C divided in the width direction. While the slit 728 of the long hinge 712 according to the present embodiment is formed by etching, the method for forming the slit 728 according to the present disclosure is not particularly limited.

The two slits 728 are respectively formed between the wiring lines 54 and 55 and between the wiring lines 55 and 56. Thus, the three wiring lines 54, 55, and 56 are disposed on the divided hinges 712A, 712B, and 712C, respectively.

Before the explanation of the advantageous effects of the second modification, the following describes a case where no slit 728 is formed in the long hinge 712. If no slit 728 is formed and a tensile load acts on the long hinge 712, for example, strain is generated in the frame region arc 620. The amount of strain increases from the center of the frame region arc 620 in the width direction toward the inner periphery or the outer periphery. Therefore, the amount of strain generated in the wiring line 55 disposed at the center of the frame region arc 620 in the width direction is smaller, and the amount of strain generated in the wiring lines 54 and 56 is larger.

By contrast, the amount of strain generated in the frame region arc 620 according to the second modification increases from the center of each of the divided hinges 712A, 712B, and 712C in the width direction toward the inner periphery or the outer periphery. Therefore, the amount of strain generated in the wiring lines 54 and 56 is smaller than when no slit 728 is formed. As a result, the wiring lines 54 and 56 are less likely to be broken.

While the second modification has been described, the long hinge 712 having no slit 728 according to the present disclosure may be provided with a plurality of wiring lines. Next, a third modification is described.

Figure 9:
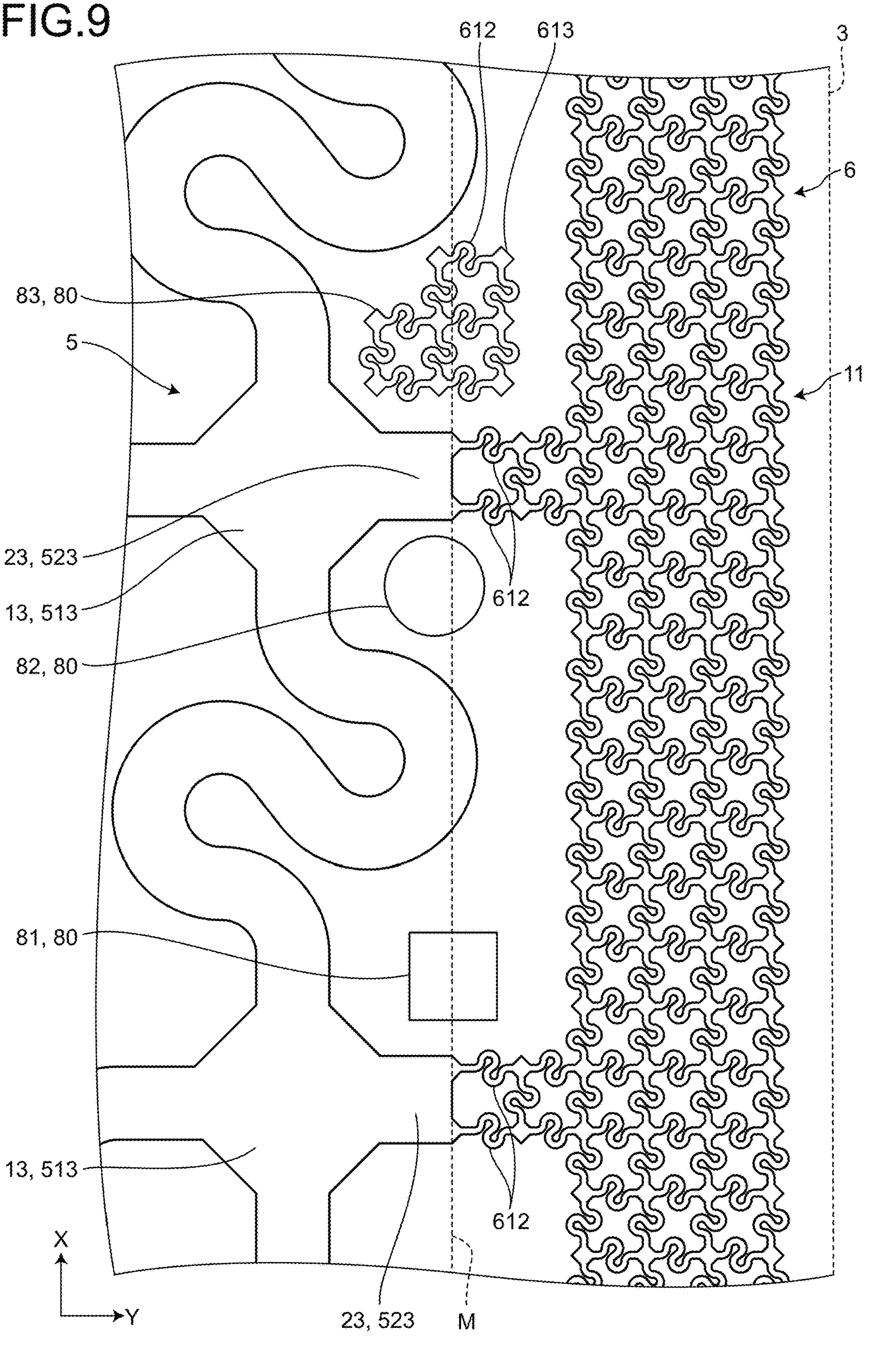
FIG. 9 is an enlarged view of a region at and near the boundary between the center region and the frame region in the resin base member according to a third modification.

FIG. 9 is an enlarged view of a region at and near the boundary between the center region 5 and the frame region 6 in the resin base member 11 according to the third modification. The resin base member 11 according to the third modification is different from the first embodiment in that it includes dummy portions 80. The dummy portion 80 is not coupled to other hinges 12 or bodies 13. In other words, the dummy portion 80 is not provided with the wiring of the array layer 30. The dummy portion 80 overlaps the imaginary line M in plan view. The imaginary line M according to the third modification extends between the center region first base 523 extending from the center region body 513 and the frame region hinge 612.

The following describes the advantageous effects of the third modification. When a tensile load in the second direction Y acts on the stretchable device 100, for example, stress may concentrate on the boundary (a part overlapping the imaginary line M) between the center region first base 523 and the frame region hinge 612 having different rigidity. In the third modification, the dummy portions 80 are disposed at the boundary between the center region first base 523 and the frame region hinge 612. This configuration increases the rigidity at the boundary, thereby preventing stress from concentrating on the boundary between the center region first base 523 and the frame region hinge 612.

While the third modification has been described above, the shape of the dummy portion 80 according to the present disclosure is not particularly limited. For example, as illustrated in FIG. 9, the dummy portion 80 may be a square-shaped dummy portion 81 or a circular dummy portion 82 in plan view. Alternatively, the dummy portion 80 may be a dummy portion 83 composed of the frame region hinges 612 and the frame region bodies 613.

What is claimed is:

1. A stretchable device comprising:

a stretchable substrate extending in a planar direction including a first direction and a second direction intersecting the first direction; and a pair of stretchable resin layers with the stretchable substrate interposed therebetween in a stacking direction intersecting the planar direction, wherein one of the stretchable resin layers has a surface facing a side opposite to the stretchable substrate, the surface has, when viewed in the stacking direction, a center region positioned at the center of the surface and a frame region positioned at ends of the surface and surrounding the center region, the stretchable substrate comprises a resin base member and an array layer disposed in the stacking direction, the resin base member comprises a hinge meandering and extending in the planar direction, the hinge comprises a plurality of arcs formed in an arc shape when viewed in the stacking direction, the arcs have a center region arc disposed in the center region and a frame region arc disposed in the frame region, and the radius of curvature of the frame region arc is smaller than the radius of curvature of the center region arc.

2. The stretchable device according to claim 1, wherein the frame region arc and the center region arc are similar in shape.

3. The stretchable device according to claim 2, wherein the resin base member comprises a plurality of the hinges, the hinges comprise:

a center region hinge disposed in the center region and having the center region arc; and a frame region hinge disposed in the frame region and having the frame region arc, and the frame region hinge and the center region hinge are similar in shape.

4. The stretchable device according to claim 3, wherein the resin base member comprises a plurality of bodies to which ends of a plurality of the hinges are coupled, the bodies comprise:

a center region body disposed in the center region and coupled to the center region hinge; and a frame region body disposed in the frame region and coupled to the frame region hinge, the frame region body and the center region body are similar in shape, and a reduction ratio of the frame region hinge to the center region hinge is equal to a reduction ratio of the frame region body to the center region body.

5. The stretchable device according to claim 1, wherein the array layer includes a plurality of wiring lines disposed in the frame region and circumferentially extending outside the center region, the wiring lines comprise:

an inner peripheral wiring line; and an outer peripheral wiring line disposed on an outer side than the inner peripheral wiring line, and the width of the outer peripheral wiring line is larger than the width of the inner peripheral wiring line.

6. The stretchable device according to claim 1, wherein the resin base member comprises a plurality of the hinges, the hinges comprise a frame region hinge disposed in the frame region and having the frame region arc, the frame region hinge is provided with a plurality of wiring lines extending along the frame region hinge, and the frame region hinge has a slit that is formed between the wiring lines when viewed in the stacking direction and that divides the frame region hinge in a width direction.

7. The stretchable device according to claim 1, wherein the resin base member comprises a dummy portion not provided with wiring, and the dummy portion overlaps an imaginary line indicating a boundary between the center region and the frame region when viewed in the stacking direction.

* * * * *